United States Patent [19]
Jenq

[11] Patent Number: 5,081,592
[45] Date of Patent: Jan. 14, 1992

[54] TEST SYSTEM FOR ACQUIRING, CALCULATING AND DISPLAYING REPRESENTATIONS OF DATA SEQUENCES

[75] Inventor: Yih-Chyun Jenq, Lake Oswego, Oreg.

[73] Assignee: Tektronix, Inc., Beaverton, Oreg.

[21] Appl. No.: 463,828

[22] Filed: Jan. 16, 1990

Related U.S. Application Data

[63] Continuation of Ser. No. 175,966, Mar. 31, 1988, abandoned, and a continuation-in-part of Ser. No. 81,943, Aug. 5, 1987, abandoned.

[51] Int. Cl.$^5$ .............................................. G01R 27/00
[52] U.S. Cl. .................................... 364/487; 364/521; 324/77 R; 340/721
[58] Field of Search ............... 364/484, 485, 486, 487, 364/521; 340/700, 720, 721; 324/77 R

[56] References Cited

U.S. PATENT DOCUMENTS

| | | | |
|---|---|---|---|
| 4,072,851 | 2/1978 | Rose | 364/487 |
| 4,644,337 | 2/1987 | Shank et al. | 324/77 R X |
| 4,743,844 | 5/1988 | Odenheimer et al. | 364/487 X |
| 4,809,189 | 2/1989 | Batson | 364/487 |
| 4,812,996 | 3/1989 | Stubbs | 364/487 |

OTHER PUBLICATIONS

"Tek Products 1988 Catalog", Tektronics, Inc. P.O. Box 500, Beaverton, OR 97077, 1987, pp. 233-237.

Primary Examiner—Bruce Y. Arnold
Attorney, Agent, or Firm—Daniel J. Bedell; John P. Dellett; Francis I. Gray

[57] ABSTRACT

A system for testing electronic devices includes a waveform generator, a data acquisition system, and a computer. The waveform generator continuously generates a test signal having adjustable parameters set by the computer in response to user input. The data acquisition system acquires data representing the output of the device under test in response to the input signal and stores the last N acquired data values. The computer transfers a data sequence from the acquisition system to another memory and generates in a window on a terminal screen a wavgeform display representing the stored data sequence. The computer also displays menu items referencing mathematical operations that may be performed on one or more data sequences. When a user selects one of the menu items, the computer prompts the user to select one or more windows containing waveform displays. Thereafter, the computer performs the selected operation on the data sequence controlling the waveform displays in the selected windows. When the result of the operation is a new data sequence, the computer stores the new data sequence in memory and then produces in a user-selected window a new waveform display based on the new data sequence.

1 Claim, 10 Drawing Sheets

TEST SYSTEM FOR ACQUIRING, CALCULATING AND DISPLAYING REPRESENTATIONS OF DATA SEQUENCES

CROSS-REFERENCE TO RELATED APPLICATIONS

This is a Continuation of application of Ser. No. 07/175,966 filed Mar. 31, 1988 and now abandoned which was a continuation-in-part of U.S. Pat. No. 4,858,142 issued Aug. 15, 1989 entitled "Digitizer Effective Resolution Measurement System Using Sinewave Parameter Estimation".

BACKGROUND OF THE INVENTION

The present invention relates to an instrument that acquires sequences of digital data, performs mathematical operations on the acquired data sequences to synthesize new data sequences and then displays waveform representations of the synthesized data sequences.

Many electronic devices produce digital or analog output signals in response to periodic input signals. To test such a device one may apply a known input signal to the device, acquire the digital or analog output signal and then process the acquired signal to produce a test result characterizing the device. When a device under test produces an output data sequence, a test instrument may store the data sequence in an acquisition memory and then perform one or more calculations on the data sequence to provide the test result. When the device under test produces an analog output signal, one may first digitize the output signal to generate a data sequence representing the output signal and then perform calculations on the data sequence in order to provide a test result.

For example, aforementioned U.S. Pat. No. 4,858,142 describes a system for measuring the effective bits of resolution of an analog-to-digital (A/D) converter within a digitizer. The system tests an A/D converter by applying a sine wave of known frequency as input to the digitizer, obtaining a resulting output data sequence produced by the A/D converter, and then performing calculations on the output data sequence obtained. The system includes a waveform generator for producing a sine wave output signal, a switch for selectively connecting the waveform generator to the digitizer input, and a computer for controlling the switch and for performing calculations on the digitizer output data sequence. The computer accesses an acquisition memory within the digitizer to obtain the data sequence generated by the A/D converter in response to the waveform generator output signal.

What would be useful would be a test system that can provide any of a wide variety of test signals to any type of device under test, that can acquire a data sequence characterizing the output signal of the device under test produced in response to the test signal, and that can perform any of a wide variety of user-selectable calculations on the acquired data sequence so as to produce various test results.

SUMMARY OF THE INVENTION

In accordance with one aspect of the present invention, a computer-based instrument for testing various devices comprises an arbitrary waveform generator, a data acquisition system, and a computer. The waveform generator continuously generates a periodic analog test signal that may be applied as input to a device under test. The test signal has adjustable characteristics including amplitude, frequency and shape (i.e., sine wave, square wave, etc.) set in accordance with control data supplied to the waveform generator by the computer. The acquisition system continuously receives either a digital or an analog output signal produced by the device under test in response to the test signal. When the output signal produced by the device under test is a continuous sequence of digital data, the acquisition system stores the N most recent data values of the sequence in an addressable acquisition memory. When the device under test produces an analog output signal, the acquisition system digitizes the analog signal to produce a data sequence representing the analog signal and then stores the N most recently generated data elements of the sequence in the acquisition memory. A user inputs commands to the computer by using a mouse controlled cursor to point to menu items or windows displayed on a screen and then depressing a button on the mouse. In response to user command, the computer transfers the N element data record out of the acquisition memory, stores it in another memory and generates in a window on a terminal screen a waveform display representing the stored data sequence.

In accordance with another aspect of the invention, the computer displays a menu on the screen having menu items referencing various mathematical operations that may be performed on one or more data sequences. When a user selects one of the menu items, the computer opens a conversation window on the screen and prompts the user for parameters to be employed in carrying out the operation referenced by the menu item and the user types answers to the prompts. Thereafter, when the user selects one or more windows containing waveform displays, the computer performs the selected operation on the data sequence(s) controlling the selected waveform display(s). When the result of the operation is a single data value, the computer displays the value in the conversation window. When the result of the operation is a new data sequence, the computer stores the new data sequence in memory, prompts the user to select a window and then produces in the selected window a new waveform display based on the new data sequence. The user may subsequently select the new data sequence to be the subject of another menu selected operation.

Thus, the present invention acquires and displays a waveform representation of a data sequence and permits a user to select a mathematical operation to be performed on a data sequence by selecting a menu item referencing the operation and then selecting a window in which a representation of the selected sequence is displayed.

It is accordingly an object of the invention to provide a system for generating a test signal, for acquiring a digital data sequence representing the response of a device to the test signal and for performing user selected operations on the data sequence to provide test results.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DESCRIPTION OF THE PREFERRED EMBODIMENT(S)

Figure 1:
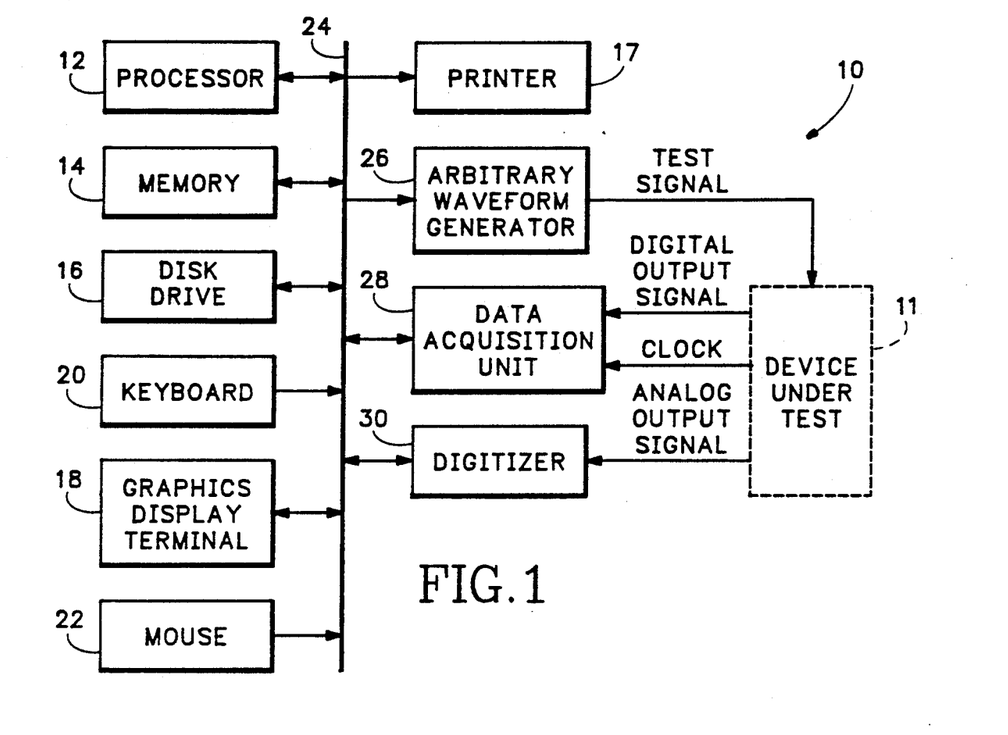
FIG. 1 is a hardware block diagram of a system for acquiring, generating and display representations of data sequences in accordance with the present invention.

With reference to FIG. 1, there is depicted in block diagram form a system 10 for acquiring data sequences from a device under test 11, for performing mathematical operations on the acquired data sequences, and for displaying waveform representations of the results. System 10 includes a processor 12, suitably including an Intel 80386 processor and 80387 math coprocessor operating under Microsoft MSDOS version 3.2 operating system. System 10 further comprises a memory 14, a disk drive 16, a printer 17, an EGA compatible graphics display terminal or monitor 18, a keyboard 20 and a mouse 22 or other graphics input device. Devices 12, 14, 16, 17, 18, 20 and 22 are interconnected by an IBM PC/AT compatible bus 24. System 10 also includes an arbitrary waveform generator 26 for generating a periodic test signal that may be applied as input to the device under test 11. A data acquisition unit 28 monitors and stores data conveyed by a multiple bit digital output signal of the device under test 11 when produced in response to the input test signal. Data acquisition is synchronized by a CLOCK signal provided by the device under test to data acquisition unit 28. When the device under test 11 produces an analog output signal in response to the test signal, a digitizer 30 periodically digitizes the analog output signal and stores the resulting data. Devices 26, 28 and 30, also connected to bus 24, are controlled by commands from processor 12 operating under program instructions stored in memory 14.

Arbitrary waveform generator 26 provides a periodic analog test signal output having adjustable frequency, amplitude and shape (e.g., square wave, sine wave, sawtooth wave) set in accordance with control data provided by processor 12 via bus 24. A suitable arbitrary waveform generator 26 shown in FIG. 2 includes a RAM 32, two registers 34 and 36, an adder 38, a bus interface circuit 40, and a digital-to-analog converter (DAC) 42. To program waveform generator 26 to provide, for example, a sine wave output signal, processor 12 writes data stored in a file in disk drive 16 into RAM 32 via bus 24 and bus interface circuit 40. The data at each address in RAM 32 is selected such that when RAM 32 is sequentially addressed over its full address range it reads out a data sequence that varies as a single cycle of a sine wave. DAC 42 converts the data sequence to an analog sine wave signal provided as the test signal output of waveform generator 26.

Figure 2:
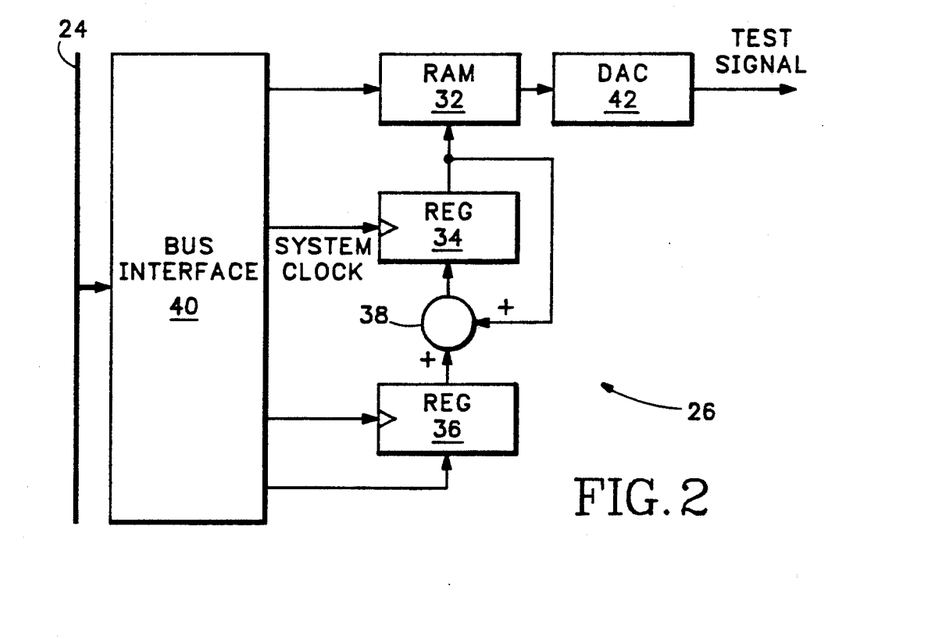
FIG. 2 is a hardware block diagram of the arbitrary waveform generator of FIG. 1.

RAM 32 is addressed by data stored in register 34. Register 34 stores the output of adder 38 on each cycle of a system clock signal conveyed on bus 24 and applied to an input enable terminal of register 34. Adder 38 sums the content of register 36 with the last data value stored in register 34 to provide the input to register 34. On each cycle of the system clock the address input to RAM 32 is incremented by the value of data stored in register 36. Since register 34 is of finite length, its stored value periodically overflows through zero and starts increasing again. Thus, register 34 sequentially addresses RAM 32 over its full range when register 34 is regularly input enabled by the system clock signal and causes RAM 32 to read out a periodic digital signal to DAC 42. In response, DAC 42 produces a periodic test signal of shape and amplitude controlled by the data stored in RAM 32. Processor 12 of FIG. 1 sets the data value in register 36 to control the size of of the step by which the address stored in register 34 is incremented during each system clock cycle, thereby to control the frequency of the test signal output of DAC 42.

Figure 3:
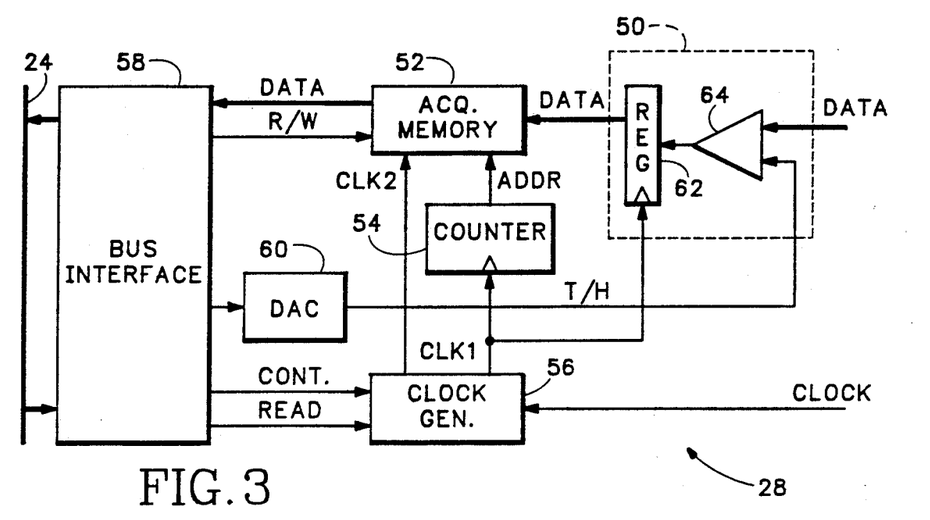
FIG. 3 is a hardware block diagram of the data acquisition unit of FIG. 1.

Data acquisition unit 28 of FIG. 1 is shown in more detailed block diagram form in FIG. 3. A probe interface circuit 50 receives data from the device under test and passes the data to an acquisition memory 52. A counter 54 counts pulses of an output clock signal CLK1 produced by a clock generator circuit 56 and addresses acquisition memory 52 with its count output. The device under test asserts the CLOCK signal each time it generates a new element of an output data sequence. The clock generator circuit 56 delays the CLOCK signal to provide the CLK1 signal to counter 54. Clock generator circuit 56 also provides a second clock signal CLK2 to a read/write control input of acquisition memory 52. The CLK2 signal causes the acquisition memory 52 to store the data output of probe interface circuit 50 when it is write enabled by a read/write control signal (R/W) from a bus interface circuit 58. Processor 12 of FIG. 1 controls the state of the R/W signal by transmitting commands to circuit 58 via bus 24.

To acquire and store the data output of the device under test, the R/W signal is set to cause acquisition memory 52 to store the data output of a register 62 within probe interface circuit 50. Register 62 is input enabled by the CLK1 output signal of clock generator circuit 56 and stores an output data word produced by a set of comparators 64 whenever register 62 is input enabled. Each comparator 64 receives as input a separate bit of the digital data output of the device under test. A threshold level signal (T/H) produced by a DAC 60 controls a second input of each comparator 64. The magnitude of the threshold signal is controlled by data provided by processor 12 of FIG. 1 and stored in bus interface circuit 58. The threshold signal level is set to match the logic transition level employed by the device under test so that the outputs of comparators 64 appropriately reflect the states of the input data bits. Acquisition memory 52 suitably comprises 4096 addresses and counter 54 suitably has a 12 bit output. Counter 54 counts up to 4096, overflows to 0 and then starts counting up again. Thus, once acquisition memory 52 has stored 4096 data elements of an incoming data sequence, it writes each subsequently received element of the incoming sequence over its longest stored data element.

Processor 12 of FIG. 1 can suspend the data acquisition process at any time and transfer a data sequence out of acquisition memory 52 for storage in memory 14 of FIG. 1. To read data out of acquisition memory 52, processor 12 commands bus interface circuit 58 to set the R/W signal to switch acquisition memory 52 to a read mode. At the same time, bus interface circuit 58 asserts a control signal applied to clock generator circuit 56 which causes the clock generator to produce its output CLK1 and CLK2 signals in response to a READ signal provided by bus interface circuit 58 rather than in response to the CLOCK signal provided by the device under test. Thereafter, the bus interface circuit 58 sequentially asserts the READ signal. The READ signal causes clock generator 56 to successively assert the CLK1 signal thereby causing counter 54 to sequentially address acquisition memory 52. As the data stored in acquisition memory 52 is read out it is transferred for storage in memory 14 via bus interface 58 and bus 24. When a data sequence had been read out of memory 56 processor 12 of FIG. 1 causes bus interface circuit 58 to reset the R/W and control signals to acquisition memory 52 and clock generator 56 so that the data acquisition unit 28 resumes acquiring input data from the device under test.

Figure 4:
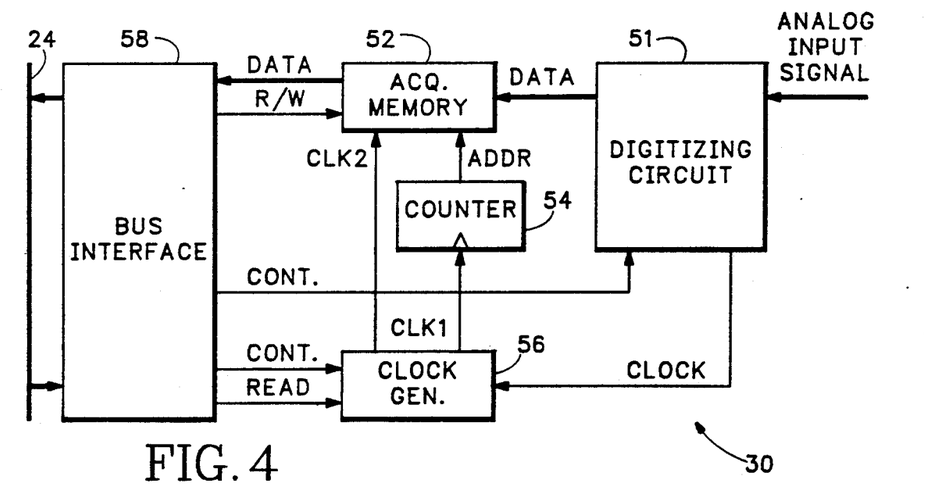
FIG. 4 is a hardware block diagram of the digitizer of FIG. 1.

The digitizer 30 of FIG. 1, shown in FIG. 4, operates in a fashion substantially similar to data acquisition unit 28 of FIG. 3 except that it includes a digitizing circuit for digitizing an analog input signal to provide data input to an acquisition memory. Component devices of the digitizer 30 of FIG. 4 and the data acquisition unit 28 of FIG. 3 having similar functions are identified by similar reference numerals. The probe interface circuit 50 of the data acquisition unit 28 of FIG. 3 has been replaced in the digitizer of FIG. 4 with a conventional digitizing circuit 51 that periodically digitizes an analog input signal to produce the data input to acquisition memory 52. The digitizing circuit 51 also provides the CLOCK signal input to clock generator circuit 56. Sampling frequency, scaling and other operating parameters of digitizing circuit 51 are adjusted by control commands transmitted to the digitizing circuit from the processor 12 of FIG. 1 by way of bus 24 and bus interface circuit 58. Processor 12 can suspend data acquisition by acquisition memory 52 and read data out of the acquisition memory using the same procedure that it uses to read data out of the data acquisition unit 28 of FIG. 3 as described hereinabove.

Figure 5:
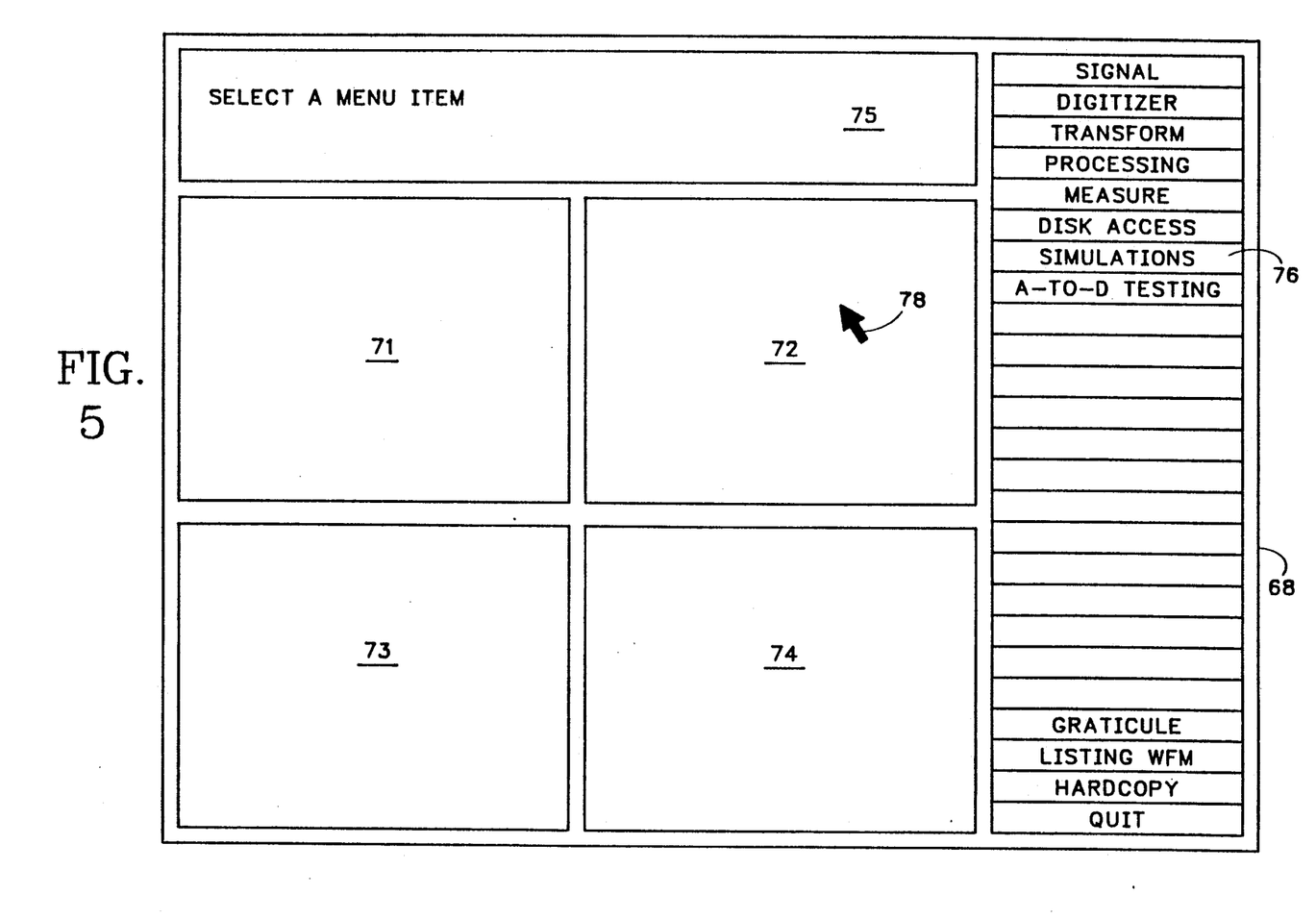
FIGS. 5-10 show example displays produced by the system of FIG. 1.

Processor 12 displays on graphics display terminal 18 of FIG. 1 waveforms representing data sequences stored in memory 14. FIG. 5 shows an initial display produced on a screen 68 of the graphics terminal at system start up. The display includes four "waveform display" windows 71-74, a "conversation" window 75, and a "menu" window 76. The system can display a waveform in each window 71-74, each waveform representing a selected data sequence stored in memory 14 of FIG. 1. The system uses conversation window 75 to display prompts to a user, to display data entered into the system via keyboard 20 of FIG. 1, and to display results of various calculations and other information. Menu window 76 may display any one of a number of menus. Each menu item references an operation to be performed or another menu to be displayed by the system when the menu item is selected. A user moves mouse of FIG. 1 to position a cursor 78 at a desired location on screen 68 and may select an item of a menu in window 76 by moving the cursor over the menu item and depressing a button on the mouse.

A "main" menu is initially displayed in menu window 76. Selectable main menu items reference the following operations:

SIGNAL

This operation replaces the main menu in window 76 with a "signal" menu that allows a user to adjust characteristics of the output test signal produced by the arbitrary waveform generator 26 of FIG. 1.

DIGITIZER

This operation replaces the main menu with a "digitizer" menu that allows a user to adjust sampling frequency and other operating parameters of the digitizer 30 of FIG. 1.

TRANSFORM

This operation replaces the main menu with a "transform" menu that permits a user to select various mathematical operations ("transformations") to be performed on one or more data sequences represented by waveforms displayed in user selected windows 71-74.

PROCESSING

This operation replaces the main menu with a "processing" menu that performs selected arithmetic operations on one or more data sequences represented by waveforms displayed in user selected windows 71-74.

MEASURE:

This operation replaces the main menu with a "measurements" menu that permits a user to select various measurement operations to be performed on a displayed waveform.

DISK ACCESS

This operation replaces the main menu with a "disk access utilities" menu that permits a user to access a directory of data files stored in disk drive 16 of FIG. 1, to load a data file containing a data sequence into memory and display a waveform representing the data sequence in a user-selected window 71-74, and to store a data sequence in the memory as a data file in disk drive 16.

SIMULATIONS

This operation replaces the main menu with a "simulations" menu that permits a user to specify various data sequences to be generated and displayed as waveforms.

A-TO-D TESTING

This operation replaces the main menu with an "A-to-D testing" menu that permits a user to select various test operations to be performed on an analog-to-digital converter under test.

DRAW GRATICULE

This operation overlays a grid on a waveform display in a user selected window 71-74.

LISTING WFM

This operation provides a printout of a data sequence controlling a selected waveform display.

HARDCOPY

This operation provides a printout of a waveform display.

QUIT

This operation returns system control to the disk operating system.

Figure 6:
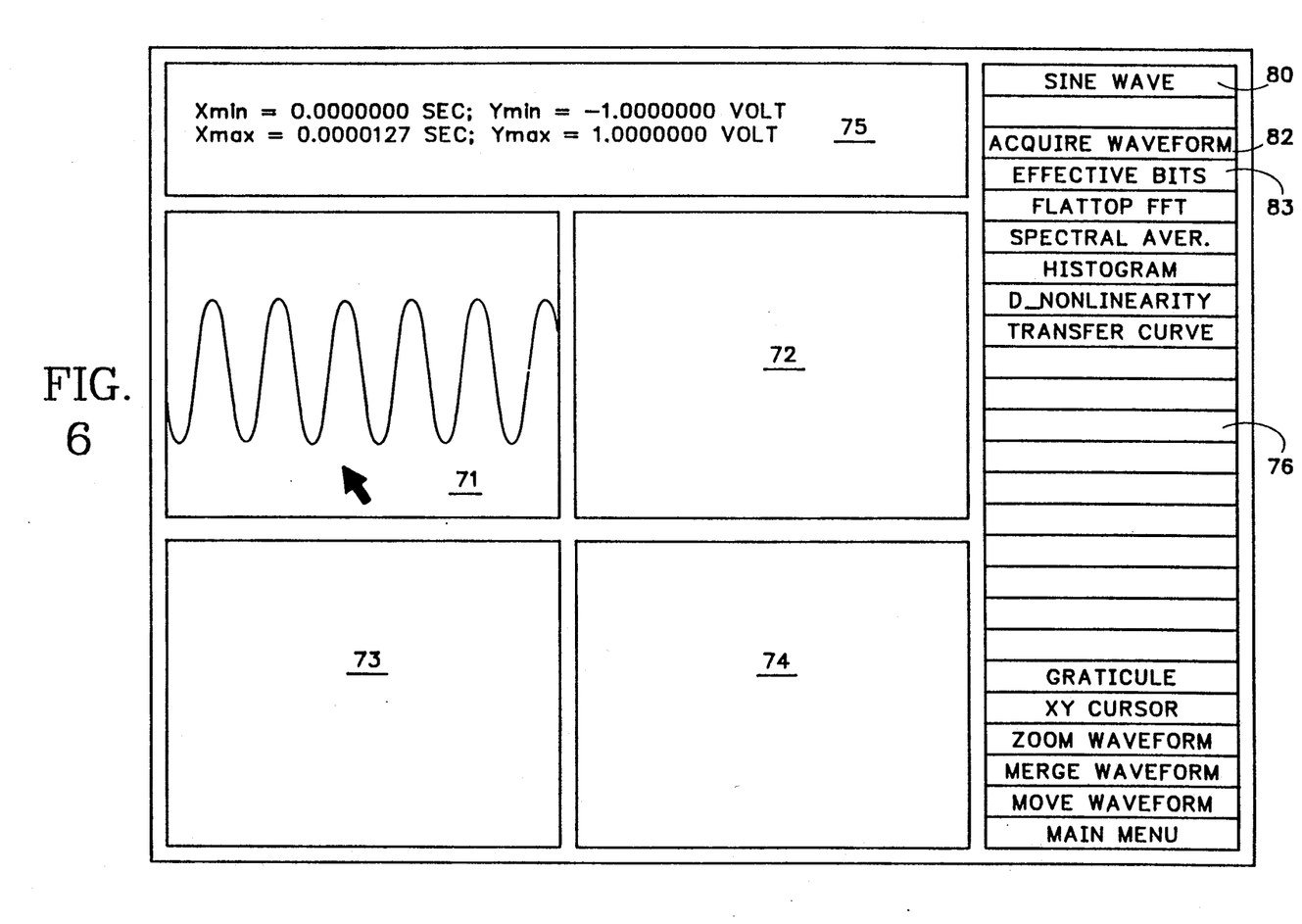

The preferred embodiment of the present invention as described herein is particularly adapted for testing an A/D converter. To test an A/D converter, a user first connects the test signal output of the arbitrary waveform generator 26 of FIG. 1 to the input of the A/D converter and connects digital and clock signal outputs of A/D converter to the data acquisition unit 28. When the user then selects the A-TO-D TESTING item of the main menu shown in FIG. 5 the system replaces the main menu display in menu window 76 with a display of the A-to-D testing menu as shown in FIG. 6. When the user selects a "sine wave" menu item 80 the system displays a prompt in conversation window 75 asking the user to enter a frequency of a sine wave test signal to be generated. When the user enters a frequency parameter value using the keyboard, the system sets arbitrary waveform generator 26 to produce a sine wave test signal output having the user-selected frequency.

The user then selects an "Acquire Waveform" menu item 82 and the system responds by displaying prompts in conversation window 75 asking the user to input the logic threshold of the A/D converter output data, the number of bits of data in the output signal, the frequency of the CLOCK signal, and a record length (not greater than 4096) to be displayed. Once the user has provided the requested input parameters, the system adjusts the threshold DAC 60 in the data acquisition unit 28 of FIG. 3 for the user-indicated threshold value and the acquisition unit begins to acquire output data produced by the A/D converter under test. The system then displays a prompt requesting the user to use the mouse to select any one of the four waveform display windows 71-74. The data acquisition unit 28 receives the data output of the A/D converter and stores the last acquired 4096 data elements of the output data sequence received from the A/D converter. After the user selects one of the windows, the system begins to periodically read a portion of the data sequence out of the acquisition memory 52 of FIG. 3, to store the data sequence as a data record in memory 14 of FIG. 1 and to generate a waveform display in the selected window 71-74 representing the stored sequence. The length of the data sequence read out of the acquisition memory is determined by the user's response to the record length prompt.

FIG. 6 shows a resulting waveform display produced in window 71. The display looks like a sine wave because the input signal to the A/D converter under test is a sine wave. When the user subsequently depresses the mouse button, the system stops reading data out of the acquisition memory and stops updating the display in window 71. The waveform display thereafter remains fixed. The system also provides a data display in the conversation window 75 indicating the maximum and minimum values Ymax and Ymin and relative times Xmin and Xmax represented by the left and right ends of the waveform display.

Figure 7:
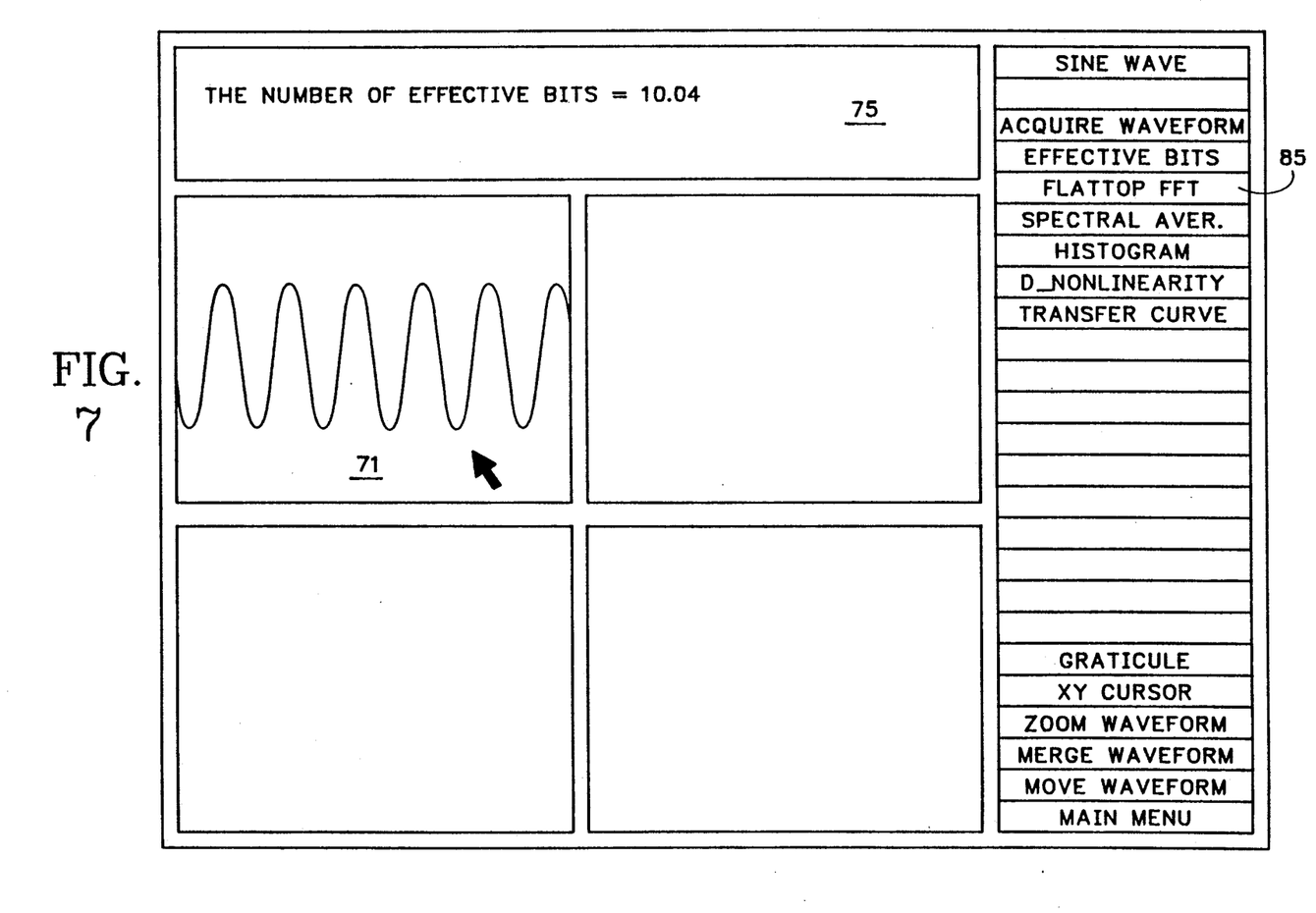

The user may then cause the system to calculate the "effective bits of resolution" of the A/D converter by selecting an "Effective Bits" menu item 83. The system responds by prompting the user to select a waveform display representing the data output of the A/D converter under test. When the user selects window 71, as shown in FIG. 7, the system calculates the effective bits of resolution of A/D converter from the data sequence stored in memory 14 that controls the waveform display in window 71. The result of the calculation is displayed in the conversation window 75. (The effective bits of resolution calculation performed is explained in detail in U.S. Pat. No. 4,858,142 incorporated herein by reference.)

Figure 8:
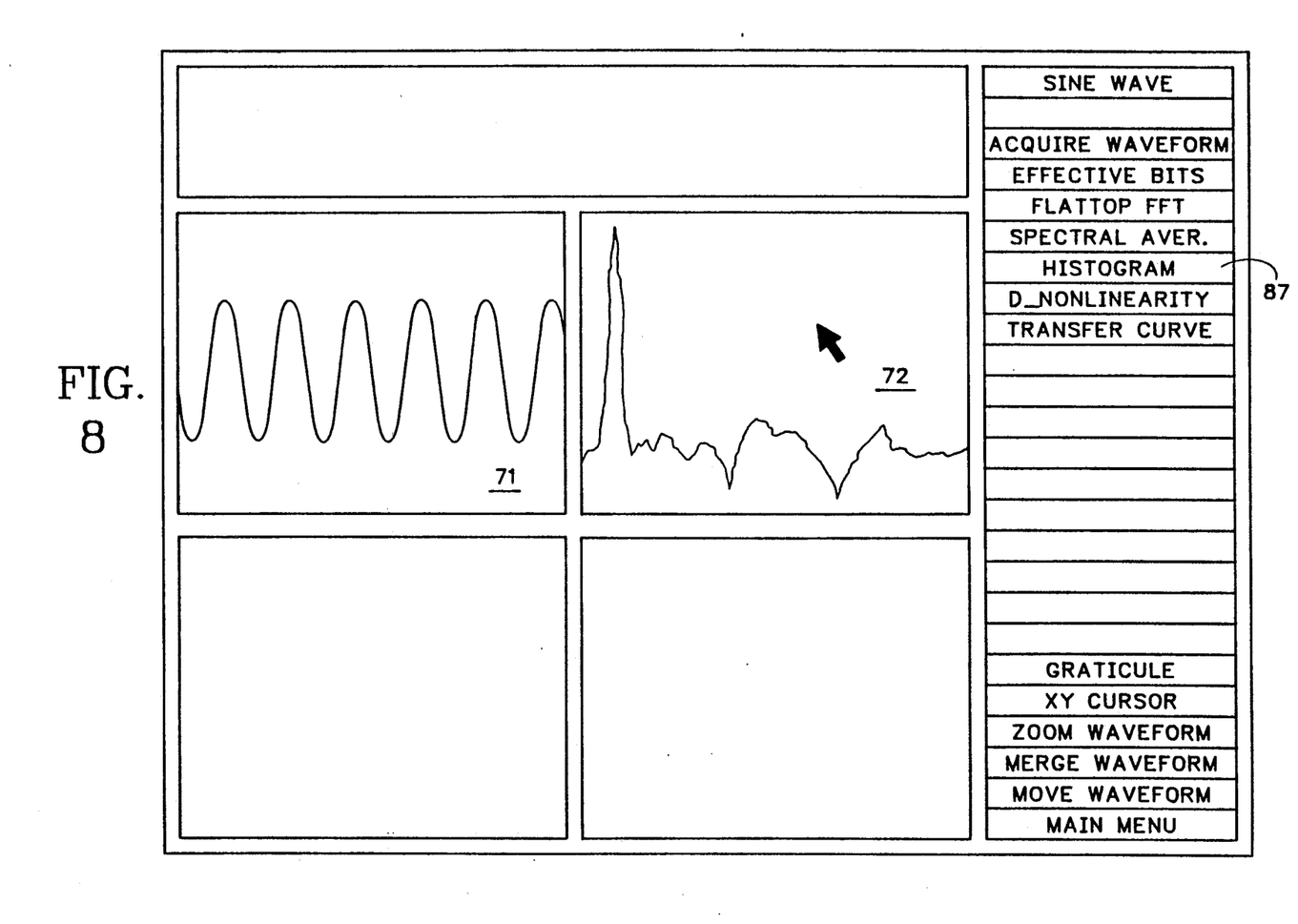

The user may next initiate a "Flattop" Fourier transform operation on the A/D converter output data. The operation generates an output data sequence representing amplitudes of frequency components of an input data sequence. An ideal A/D converter would produce an output digital sequence having only a single frequency component in response to a sine wave input signal. After the user selects the FLATTOP FFT menu item 85, the system prompts the user to select a window in which to display a waveform representing the input data sequence for the operation. The user then selects window 71. The system then prompts the user to select a window to contain a display of a waveform representing the Fourier transform operation output sequence to be computed. After the user selects, for example window 72, the system computes the Fourier transform of the A/D converter output data sequence and generates the appropriate display in window 72 as shown in FIG. 8.

Figure 9:
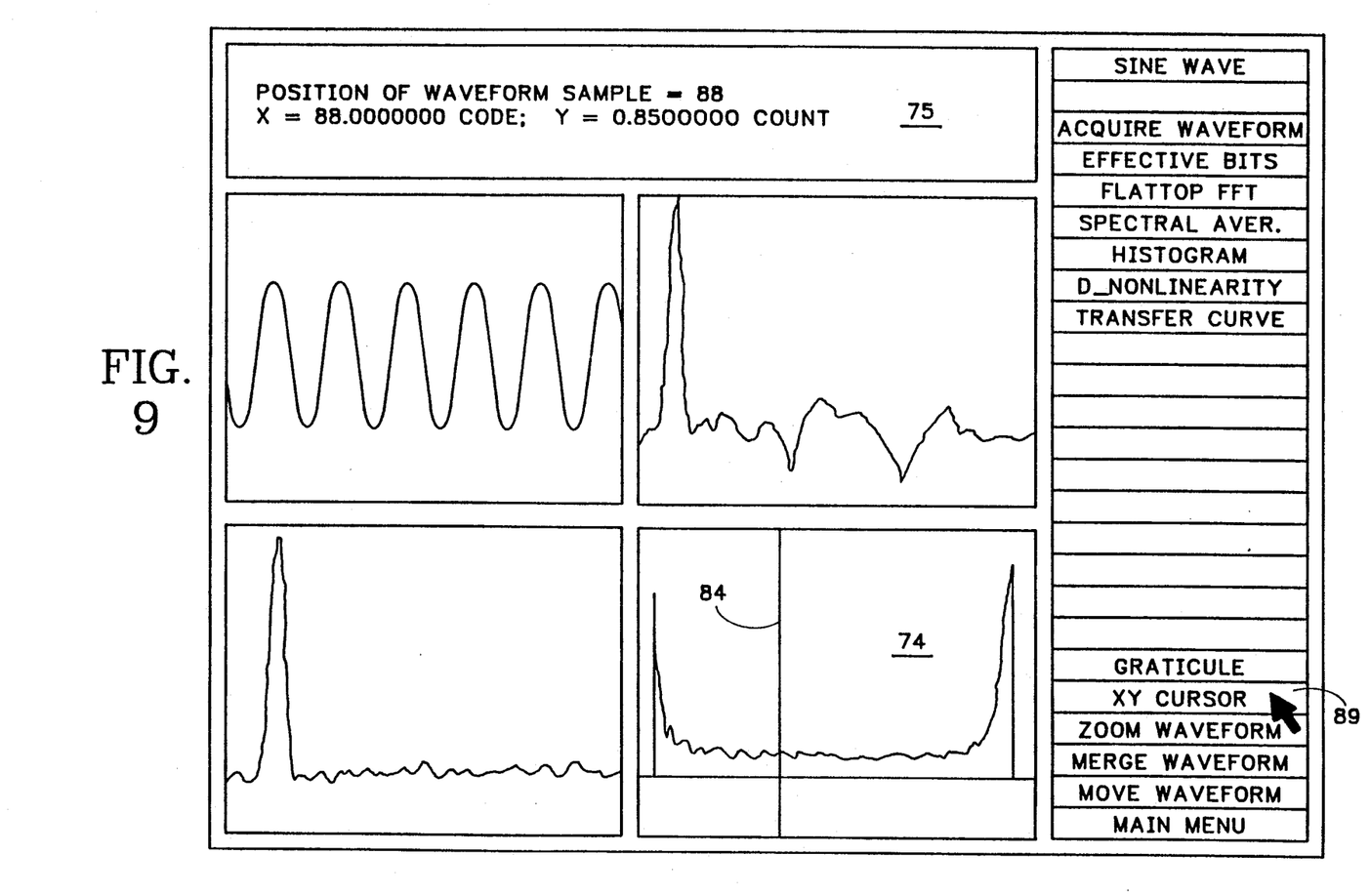

The user may select a "Histogram" menu item 87 to initiate an operation wherein the sequences of output data produced by the A/D converter under test are continuously acquired and a histogram data sequence is produced. Each element of the histogram data sequence represents a percentage of converter output data elements having a particular value. As shown in FIG. 9, the histogram is plotted in window 74 when the user selects window 74 and is continuously updated as new data is acquired. When the user subsequently depresses the mouse button, data acquisition ceases and the histogram display remains fixed.

When the user selects an XY cursor menu item 89, the system displays a horizontal and/or a vertical line cursor 84 in a selected waveform window. The operator can move the cursor using mouse 22 of FIG. 1. The system displays data in conversation window 75 indicating values represented by waveform data associated with the cursor positions. In FIG. 9 the user has initiated a vertical line cursor 84 in the window 74 containing the histogram display. The system provides a data display in the conversation window 75 indicating that the vertical line cursor 84 intersects the waveform display at a point showing that 0.85% of all values output by the A/D converter output data had a value of 88.

Figure 10:
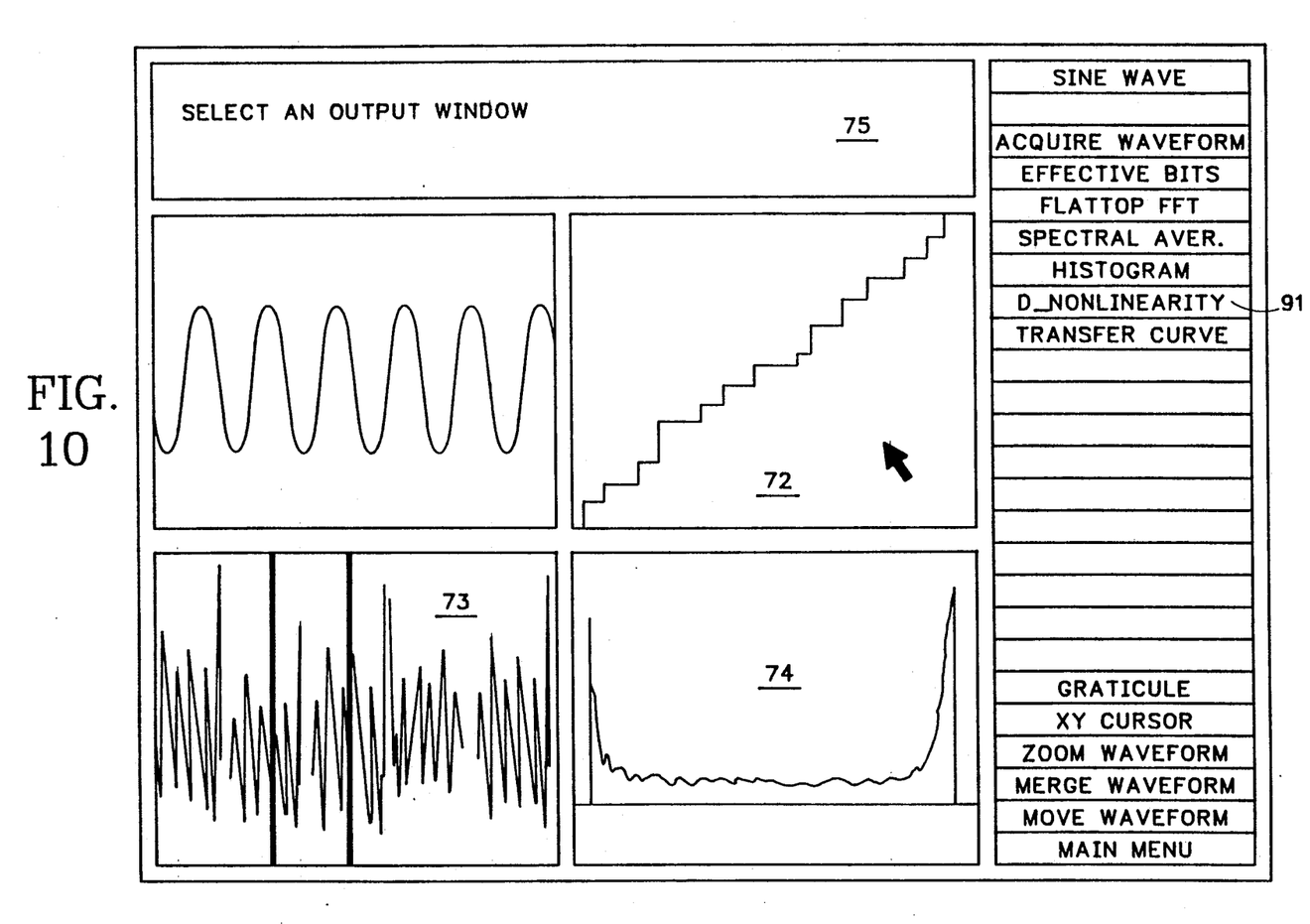

FIG. 10 shows in window 73 results of an operation performed on the histogram data represented by the display in window 74 when the "D_Nonlinearity" menu item 91 is selected. The menu item invokes a differential nonlinearity operation that processes the histogram to produce a data sequence representing the nonlinearity of the A/D converter's transfer characteristic in terms of a percentage of its least significant bit as a function of output data value. FIG. 10 also shows in window 72 the results of an operation performed on the data sequence controlling the display in window 73 when the user selects a Transfer Curve menu item. The transfer curve operation produces a data sequence indicating the transfer characteristic of the A/D converter. The transfer characteristic of an ideal A/D converter is a staircase waveform having regular steps. Any variation in step height or width is an indication of the non-linearity of the converter.

As has been illustrated in the foregoing examples, the system of the present invention produces a test signal for application as input to a device under test, acquires an output data sequence produced by the device under test and displays a waveform representation of the data sequence. Moreover, the system permits the user to easily select and specify parameters of various mathematical operations to be performed on the acquired data sequence. When the result of an operation is a single data value, the value is displayed in the conversation window. When the result of an operation is a calculated data sequence, the system stores the calculated data sequence in memory and displays a waveform representation of the sequence in a window. The user may then select the calculated data sequence to be the subject of yet another operation by selecting the operation and then selecting the waveform representing the calculated sequence to be the subject of the operation.

Figure 11:
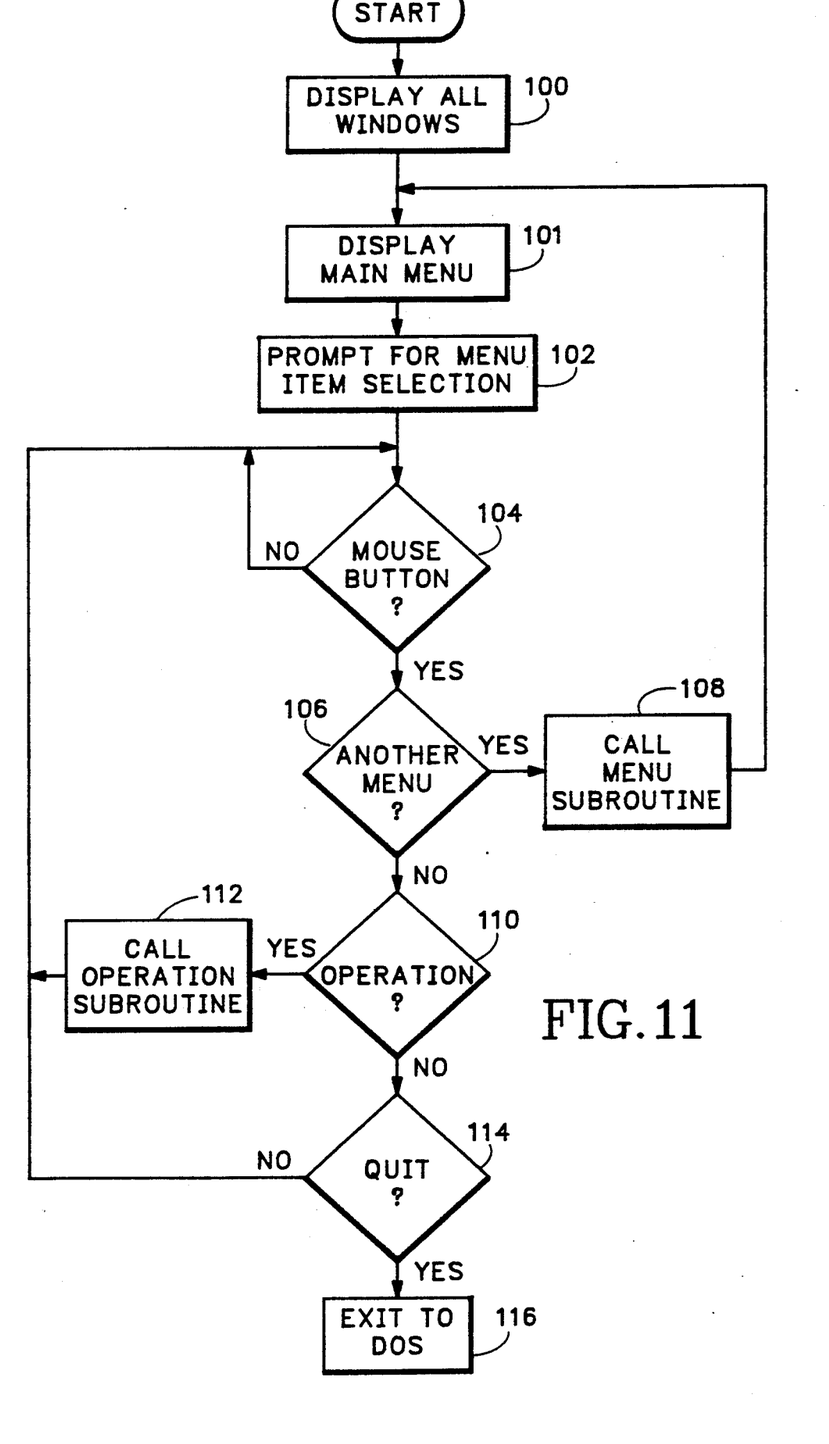
FIGS. 11-13 are flowcharts of software for programming the processor of FIG. 1 in accordance with the present invention.

FIG. 11 shows a flow chart of a program for controlling the operation of processor 12 of FIG. 1 following system startup. Upon system startup, the system initially generates the display of the six windows 71-76 (steps 100-102) as shown in FIG. 5. Windows 71-76 are displayed in step 100 and are initially empty. But shortly thereafter, the main menu is displayed in menu window 76 (step 101) and a prompt is displayed in conversation window 75 requesting the user to select a menu item (step 102).

The system then waits for the user to depress the mouse button (step 104). When the user depresses the mouse button, the system determines from the current cursor position if the user has selected a menu item that calls another menu (step 106). If so, the system calls a subroutine that displays the other menu and responds to selections from that menu (step 108). When the called subroutine terminates, the program returns to step 101 where the main menu is again displayed. When the user selects a menu item indicating an operation other than displaying a new menu or quitting the program (step 110), a subroutine is called that causes the system to perform the selected operation (step 112). When the operation subroutine terminates, the program returns to step 104 where the system awaits another mouse button operation. When the user selects the QUIT menu item on the main menu (step 114), the program exits to the disk operating system (step 116). When the user depresses the mouse button while the cursor is other than on a menu item, the program flows through steps 104, 106, 110 and 114 and back to step 104.

Figures 12, 13:
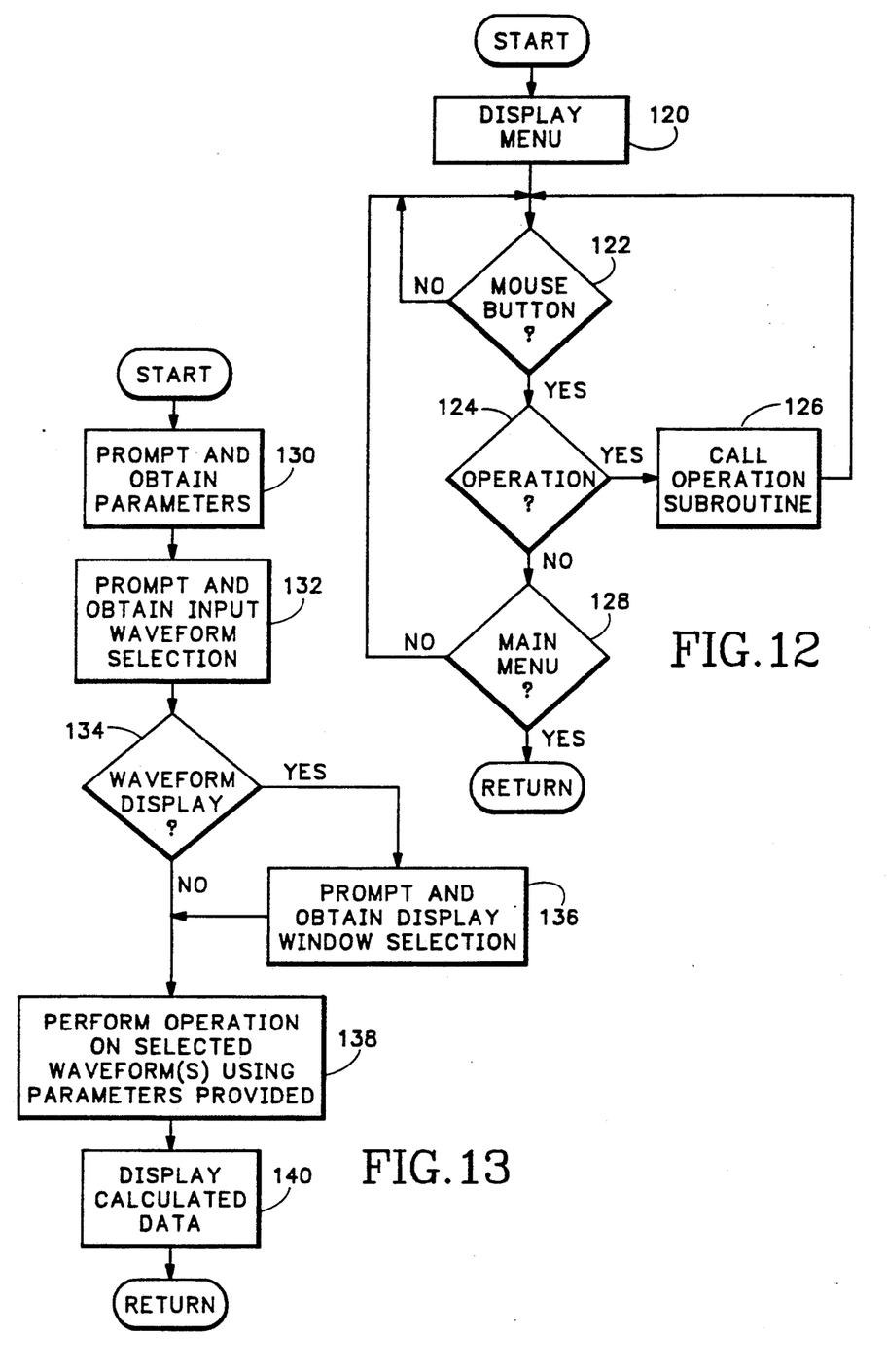

FIG. 12 is a flow chart of a typical menu subroutine that is called in step 108 of FIG. 11. Starting in step 120, the system displays an appropriate menu and then waits (step 122) until the user again depresses a mouse button. If the user selects a menu item referencing an operation (step 124), the subroutine calls yet another subroutine that performs the referenced operation (step 126). Thereafter, the program returns to step 122. When the user selects a menu item referencing the main menu (step 128), the subroutine returns to step 104 of the main menu routine of FIG. 11. When the user operates the mouse button but does not select a menu item, the subroutine of FIG. 12 cycles through steps 122, 124 and 128 and back to step 122.

FIG. 13 is a flow chart of a typical subroutine that may be called in step 126 of FIG. 12 to perform a mathematical operation on a data sequence. The system initially generates a prompt in the conversation window for input parameters (if needed) controlling the operation to be carried out by the subroutine and then obtains and stores the parameters input by the user (step 130). The system next prompts the user to select one or more windows containing waveforms and stores data indicating the memory storage locations of the data sequence(s) represented by the selected waveform(s) (step 132). If the result of the operation is to be a calculated data sequence (step 134), the system prompts the user to select a window in which to display a waveform representing the calculated data sequence (step 136). Thereafter, the system performs the operation on the selected data sequence(s) (step 138) and displays the results of the operation in the conversation window and/or in the selected waveform display window (step 140). The subroutine then returns to its caller.

Thus, the preferred embodiment of the present invention, a computer-based instrument for testing various devices, comprises an arbitrary waveform generator, a data acquisition system, and a computer. The waveform generator continuously generates an analog test signal having adjustable parameters set by the computer in response to user input. The data acquisition system continuously acquires data representing the output of the device under test in response to the input signal and stores the last N acquired data values. In response to user input, the computer transfers a data sequence from the acquisition system to another memory and generates in a window on a terminal screen a waveform display representing the stored data sequence. The computer also displays menu items referencing mathematical operations that may be performed on one or more data sequences. When a user selects one of the menu items, the computer prompts the user to provide parameter values to be employed in carrying out the operation referenced by the menu item, and to select one or more windows containing waveform displays. Thereafter, the computer performs the selected operation on the data sequence(s) controlling the selected waveform display(s). When the result of the operation is a new data sequence, the computer stores the new data sequence in memory and produces in a user-selected window a new waveform display based on the new data sequence. The user may subsequently select the new data sequence to be the subject of another menu selected operation.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A method of providing a waveform display characterizing a device under test comprising the steps of:

storing a data sequence from the device under test that represents the response of the device under test to an input signal;

displaying a plurality of windows on a display screen, a first one of the windows displaying a first waveform representing the data sequence;

displaying menu items in a second one of the windows, each menu item corresponding to one of multiple operations that may be performed on the data sequence to produce an output data sequence;
selecting one of the menu items and a third one of the windows;
performing the operation indicated by the selected menu item to produce from the data sequence the output data sequence;
storing the output data sequence;
displaying in the third window a second waveform representing the output data sequence;
selecting another one of the menu items and a fourth one of the windows;
performing the operation indicated by the another selected menu item to produce from the data sequence another output data sequence;
storing the another output data sequence; and
displaying in the fourth window a third waveform representing the another output data sequence.

* * * * *